(12) United States Patent
Tsunekawa

(10) Patent No.: US 9,300,130 B2
(45) Date of Patent: Mar. 29, 2016

(54) SWITCHING MODULE INCLUDING SWITCHING ELEMENT CONTROLLED TO BE TURNED OFF WHEN CONDUCTION FAILURE IS DETECTED

(71) Applicant: DENSO CORPORATION, Kariya, Aichi-pref. (JP)

(72) Inventor: Toyokazu Tsunekawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 209 days.

(21) Appl. No.: 13/972,266

(22) Filed: Aug. 21, 2013

(65) Prior Publication Data

US 2014/0055897 A1 Feb. 27, 2014

(30) Foreign Application Priority Data

Aug. 21, 2012 (JP) ................. 2012-182690

(51) Int. Cl.
| | |
|---|---|
| *H02H 3/20* | (2006.01) |
| *H02M 1/08* | (2006.01) |
| *H02M 1/32* | (2007.01) |
| *H02M 7/00* | (2006.01) |
| *H02M 7/5387* | (2007.01) |
| *H03K 17/082* | (2006.01) |
| *H03K 17/14* | (2006.01) |

(Continued)

(52) U.S. Cl.
CPC . *H02H 3/20* (2013.01); *H02M 1/08* (2013.01); *H02M 1/32* (2013.01); *H02M 7/003* (2013.01); *H02M 7/5387* (2013.01); *H03K 17/0828* (2013.01); *H03K 17/14* (2013.01); *H02M 3/1588* (2013.01); *H02M 2001/007* (2013.01)

(58) Field of Classification Search
USPC ................................. 361/18, 19, 20
See application file for complete search history.

(56) References Cited

U.S. PATENT DOCUMENTS 6,268,986 B1 * 7/2001 Kobayashi .......... H02P 29/0088
361/24
6,891,214 B2 * 5/2005 Mori ....................... H02M 1/00
257/294

(Continued)

FOREIGN PATENT DOCUMENTS

| JP | 01-315297 | 12/1989 |
|---|---|---|
| JP | 2000-308250 | 11/2000 |

(Continued)

OTHER PUBLICATIONS

Office Action (3 pages) dated Jul. 1, 2014, issued in corresponding Japanese Application No. 2012-182690 and English translation (3 pages).

*Primary Examiner* — Thienvu Tran
*Assistant Examiner* — Angela Brooks
(74) *Attorney, Agent, or Firm* — Nixon & Vanderhye PC

(57) ABSTRACT

A switching module includes a switching element having a control terminal, electrically connected to a first conduction path including a reference terminal, to be opened and closed by controlling the switching element to be ON and OFF. The switching element is controlled in response to a voltage difference between the reference terminal and the control terminal. Moreover, the switching module includes determining unit that determines whether or not a conduction failure has been occurred between the control terminal and an outside the switching module; and reducing unit that reduces an absolute value of the voltage difference when the determining unit determines that the conduction failure has occurred, so as to forcibly turn OFF the switching element.

10 Claims, 5 Drawing Sheets

(51) Int. Cl.
*H02M 3/158* (2006.01)
*H02M 1/00* (2007.01)

(56) References Cited

U.S. PATENT DOCUMENTS

| | | | | |
|---|---|---|---|---|
| 2001/0037801 | A1* | 11/2001 | Ito et al. | 123/644 |
| 2005/0206438 | A1* | 9/2005 | Higashi | 327/427 |
| 2008/0100978 | A1* | 5/2008 | Maebara et al. | 361/93.8 |
| 2009/0139505 | A1* | 6/2009 | Naito et al. | 123/644 |
| 2009/0160476 | A1* | 6/2009 | Omaru | 324/765 |
| 2010/0289562 | A1* | 11/2010 | Kohama et al. | 327/541 |
| 2011/0012542 | A1* | 1/2011 | Inamura et al. | 318/139 |
| 2011/0221374 | A1* | 9/2011 | Maebara et al. | 318/494 |
| 2011/0228564 | A1* | 9/2011 | Uruno et al. | 363/17 |
| 2011/0298527 | A1* | 12/2011 | Lloyd et al. | 327/478 |
| 2011/0317315 | A1* | 12/2011 | Motohashi et al. | 361/18 |
| 2012/0075753 | A1* | 3/2012 | Watanabe et al. | 361/18 |
| 2012/0112530 | A1 | 5/2012 | Komatsu et al. | |
| 2012/0139589 | A1* | 6/2012 | Machida et al. | 327/109 |
| 2012/0146613 | A1* | 6/2012 | Hamanaka et al. | 323/311 |
| 2012/0217937 | A1* | 8/2012 | Miyauchi et al. | 322/28 |
| 2012/0320649 | A1* | 12/2012 | Hamanaka | H02M 7/48 363/131 |
| 2013/0106173 | A1* | 5/2013 | Nomura | 307/9.1 |
| 2013/0106470 | A1* | 5/2013 | Takagiwa | 327/109 |
| 2013/0175959 | A1* | 7/2013 | Fukuta et al. | 318/400.27 |
| 2013/0181749 | A1* | 7/2013 | Hamanaka | H03K 17/56 327/109 |
| 2013/0229208 | A1* | 9/2013 | Hamanaka et al. | 327/109 |
| 2014/0009983 | A1* | 1/2014 | Nakamori | 363/50 |
| 2014/0077846 | A1* | 3/2014 | Taguchi et al. | 327/109 |
| 2014/0092655 | A1* | 4/2014 | Igarashi et al. | 363/56.03 |
| 2014/0111253 | A1* | 4/2014 | Fukuta et al. | 327/109 |
| 2014/0203843 | A1* | 7/2014 | Cottell | 327/81 |

FOREIGN PATENT DOCUMENTS

| | | |
|---|---|---|
| JP | 2007-208831 | 8/2007 |
| JP | 2012-100461 | 5/2012 |

\* cited by examiner

<NORMAL OPERATION>

<DURING CONDUTION FAILURE>

<DURING ON OPERATION>

| | Vcmp |
|---|---|
| V+ > V− | H |
| V+ < V− | L |

US 9,300,130 B2

SWITCHING MODULE INCLUDING SWITCHING ELEMENT CONTROLLED TO BE TURNED OFF WHEN CONDUCTION FAILURE IS DETECTED

CROSS REFERENCE TO RELATED APPLICATION

This application is based on and claims the benefit of priority from earlier Japanese Patent Application No. 2012-182690 on Aug. 21, 2012 the description of which is incorporated herein by reference.

BACKGROUND

1. Technical Field

The present disclosure relates to switching modules including a switching element disposed at a conduction path to be opened or closed thereby.

2. Description of the Related Art

Conventionally, a switching module used for an inverter circuit connected to a motor generator has been employed. According to this switching module, the switching element turns the conduction path to be ON and OFF in response to a voltage difference between the reference terminal disposed at the end portion of one side of the conduction path and the control terminal of the switching element. For example, Japanese patent application publication laid-open publication number 2012-100461 discloses an inverter circuit connected to a motor generator as a traction motor mounted on a vehicle.

The inverter circuit includes switching elements of which drive circuits are disposed on the same semiconductor substrate. The switching elements that constitute the inverter circuit are mounted inside a cooling device and terminals such as gate terminal, etc. connected to the drive circuit are extended to the semiconductor substrate. These terminals are connected to the drive circuits disposed on the semiconductor substrate.

In the assembling process of the above-described inverter circuit, when the terminal of the switching element and the drive circuit are connected by soldering, assuming degradation of the semiconductor substrate occurs even though the switching elements themselves are normal, it is necessary to replace the semiconductor substrate together with the switching element. This is because the terminals of the switching element are soldered to the semiconductor substrate. However, when a configuration in which the terminals of the switching element is connected to the drive circuit via a connector and the connector contacts between the terminals and a conductor is employed, it is not necessary to replace the switching elements themselves mounted inside the cooling device when the semiconductor substrate is replaced.

However, in this case, conduction failure between the terminal and the conductor of the connector is likely to occur due to fretting corrosion. Specifically, when conduction failure occurs during the switching element turned ON, the switching element cannot be turned OFF. Therefore, controlling the opposite side of arm of the inverter to be ON, current that short-circuits the upper arm and the lower arm flows so that it is likely to degrade the reliability of the switching element.

SUMMARY

The embodiment provides a newly developed switching module provided with a switching element that turns the conduction path to be ON and OFF in response to a voltage difference between the reference terminal disposed at the end portion of one side of the conduction path and the control terminal of the switching element.

As a first aspect of the present disclosure, a switching module includes: a switching element having a control terminal, electrically connected to a first conduction path including a reference terminal, to be opened and closed by controlling the switching element to be ON and OFF, the switching element being controlled in response to a voltage difference between the reference terminal and the control terminal; determining means for determining whether or not a conduction failure has been occurred between the control terminal and an outside the switching module; and reducing means for reducing an absolute value of the voltage difference when the determining means determines that the conduction failure has been occurred, so as to forcibly turn OFF the switching element.

DETAILED DESCRIPTION OF THE PREFERRED EMBODIMENT

First Embodiment

With reference to the drawings, hereinafter is described the first embodiment according to the present disclosure. In the first embodiment, the switching module of the present disclosure is adapted for the drive unit of the power conversion circuit connected to a rotary electric machine as an on-vehicle main equipment (i.e., traction motor).

Figure 1:
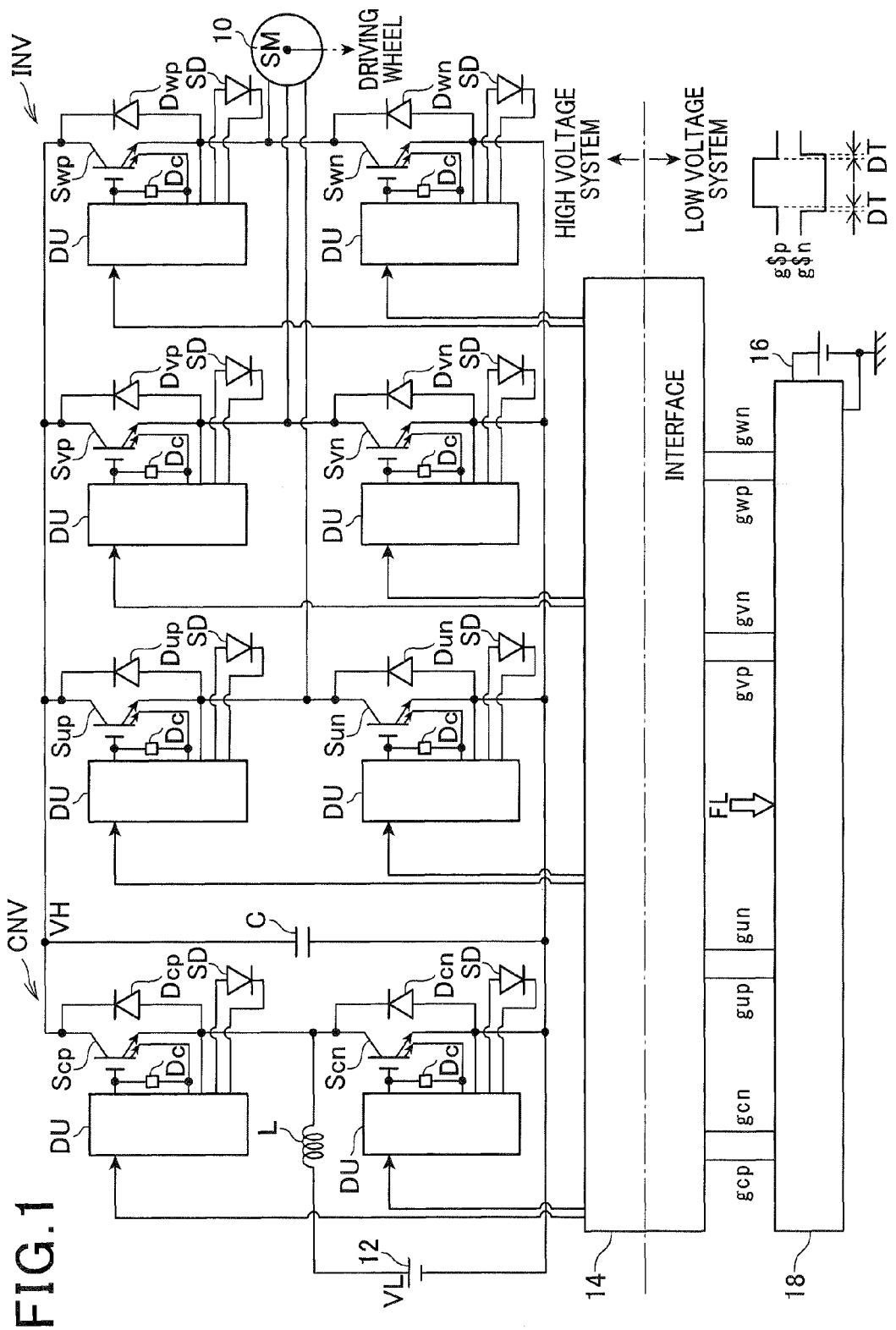
FIG. 1 is a block diagram showing an overall system configuration according to the first embodiment of the present disclosure.

As shown in FIG. 1, the motor generator 10 is employed as an on-vehicle main equipment and mechanically coupled to the drive wheel (not shown). The motor generator 10 is connected to the high voltage battery 12 via the boost converter CNV. The boost converter CNV includes a capacitor C, a pair of switching elements Scp and Scn connected in parallel to the capacitor C, a reactor L that connects connection point of a pair of switching elements Scp and Scn and the positive terminal of the high voltage battery 12. The boost converter CNV boosts the voltage of the high voltage battery 12 (e.g. several hundreds volts) to be up to a predetermined voltage (e.g. 666 volts) as an upper limit voltage by controlling the switching element Scp and Scn to be ON and OFF. Meanwhile, the inverter INV includes a series-connected module including the switching elements Sup and Sun, a series-connected module including the switching element Svp and Svn and a series-connected module including switching elements Swp and Swn. The connection points of the respective series-connected modules are connected to U-phase, V-phase and W-phase of the motor generator 10. Regarding these switching elements S$# ($=u, v, w, c; #=p, n), Insulated Gate Bipolar Transistor (IGBT) is used for the switching elements. The diodes D$# are connected to the respective switching elements such that the diodes are connected in parallel to be in reverse direction.

The control device 18 is powered by the low voltage battery 16 and performs control operations. The control device 18 controls the motor generator 10 such that the control amount thereof is controlled to be desired value by operating the inverter INV and the boost converter CNV. Specifically, the control device 18 outputs control signals gcp and gcn to the drive unit DU so as to control the switching elements Sup, Sun, Svn, Svp, Swp and Swn of the boost converter INV. Moreover, the control device 18 outputs control signals gup, gun, gyp, gvn, gwp and gwn to the drive unit DU so as to control the switching elements Sup, Sun, Svp, Svn, Swp and Swn. It is noted that the high side control signal g$p and corresponding low side control signal g$n are complement signals each other. In other words, each of the high side switching element S$p and the corresponding to the low side switching element S$n turns ON alternately. It is noted that dead time period is set during a transient period from a state when either one switching element between high side switching element S$p or low side switching element S$n being turned ON and the other switching element being turned OFF, to a state when the other switching element turns ON from OFF state. In the dead time period, both switching elements are turned OFF and defined as a period of dead time DT.

A temperature-sensitive diode SD is disposed at vicinity of the switching element S$#. Both terminals of the temperature-sensitive diode SD are connected to the drive unit DU. The protection circuit DC is connected between the gate terminal and the emitter terminal of the switching element S$#.

The high voltage battery 12 is included in the high voltage system and the low voltage battery 16 is included in the low voltage system, in which the reference potentials are different from each other. In other words, for example, the negative voltage of the high voltage battery 12 and the negative voltage of the low voltage battery 16 are set to be different from each other such that the center value between voltage at the positive terminal of the high voltage battery 12 and voltage at the negative terminal thereof is set as a frame potential of the vehicle and voltage at the negative terminal of the low voltage battery is set as a frame potential of the vehicle. The signals are transmitted between the high voltage system and the low voltage system via the interface 14 that including isolation means such as photo couplers.

Figure 2:
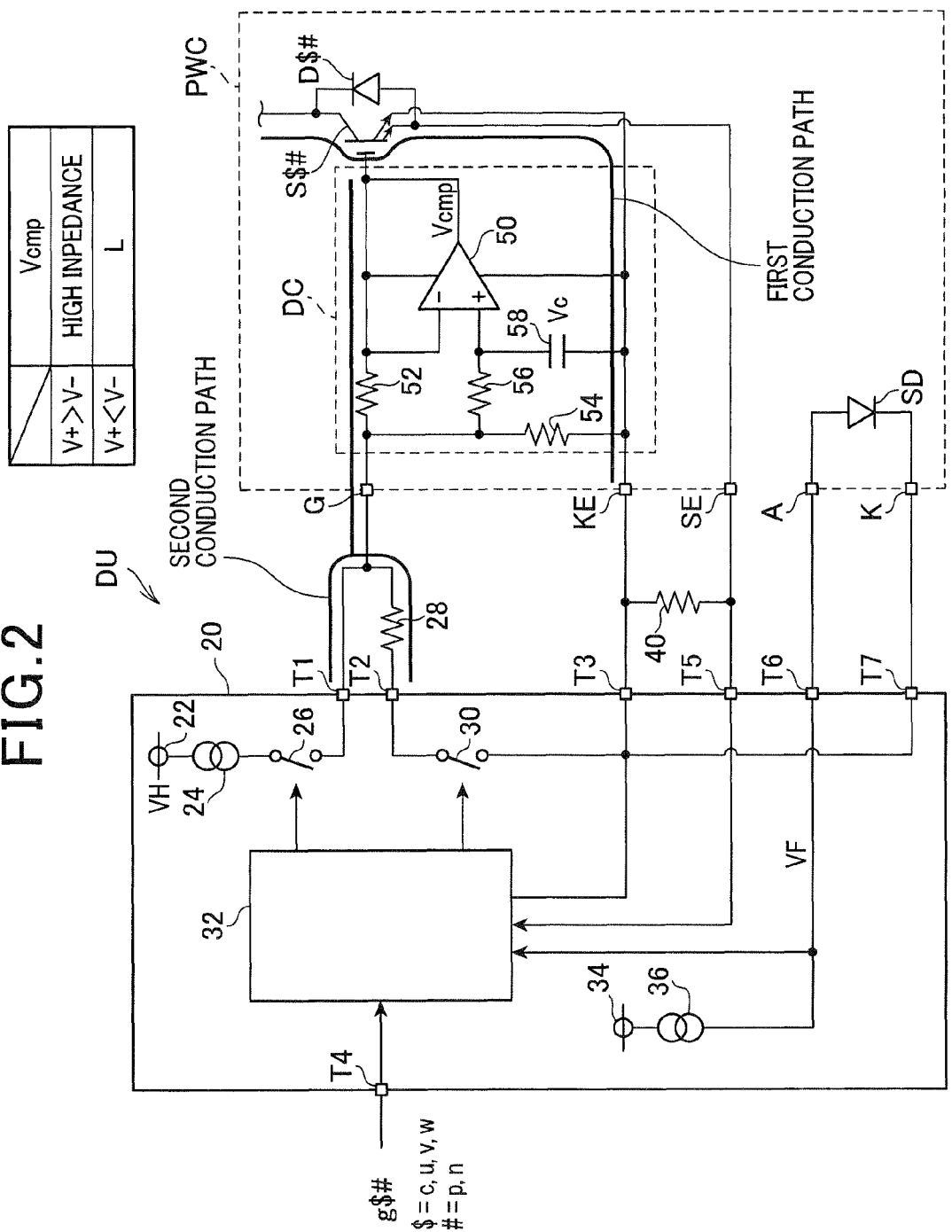
FIG. 2 is a circuit diagram showing a configuration of a drive unit and power card according to the first embodiment.

Next, configuration of the above-described drive unit and the protection circuit DC is as shown in FIG. 2.

As shown in FIG. 2, the switching element S$#, the temperature-sensitive diode SD and the protection circuit DC are accommodated in a switching module (i.e., power card: PWC) which is packaged. The power card PWC includes gate terminal G connected to the control terminal (gate) of the switching element S$#, sense terminal SE, Kelvin-emitter terminal KE, the anode terminal A and the cathode terminal K which are connected to the anode of the temperature sensing diode SD and the cathode of the temperature sensing diode SD respectively. The sense terminal SE outputs small current having a correlation with a current (i.e., collector current) that flows through the conduction path (conduction path between the collector and the emitter, i.e., first conduction path).

Meanwhile, the drive unit DU includes a drive IC (integrated circuit) 20 which is integrated to a single semiconductor circuit. The drive IC 20 includes a direct current (DC) voltage source 22. The DC power source is connected to the gate terminal G of the power card PWC via the constant current source 24, the charge switching element 26 and the terminal T1.

The gate terminal G is connected to the terminal T2 of the drive IC 20 via the discharge resistor 28. The terminal T2 connects the terminal T3 via the discharge switching element 30. The terminal T3 connects the Kelvin emitter terminal KE of the power card PWC.

The above described charge switching element 26 and the discharge switching element 30 are controlled by the drive control block 32. The drive control block 32 drives the switching elements S*# by controlling the charge switching element 26 and the discharge switching element to be complementarily ON and OFF based on the above described control signals g$# transmitted via the terminal T4. Specifically, the charge switching element 26 is turned ON and the discharge switching element 30 is turned OFF by controlling the control signal g$# to be ON command. Similarly, the charge switching element 26 is turned OFF and the discharge switching element 30 is turned ON by controlling the control signal g$# to be OFF command.

The above-described sense terminal SE is connected to the Kelvin-emitter terminal KE via the resistor 40. In this connection, voltage drop occurs at the resistor 40 by the current outputted by the sense terminal SE so that an amount of the voltage drop at the resistor 40 (sense voltage Vse) can be a detection signal of the collector current at the switching elements S$#.

The drive control block 32 monitors whether or not current value of the switching element S$# exceeds an allowable upper limit, based on the sense voltage Vse transmitted via the terminal T5. When the drive control block 32 determines that the current value exceeds the allowable upper limit, the drive control block 32 controls the charge switching element 26 to be OFF and the and the switching element S$# to be forcibly OFF.

The cathode terminal K of the power card PWC is connected to the terminal T3 via the terminal T7 whereby voltage potential of the cathode terminal of the temperature-sensitive diode SD becomes the same voltage potential of the emitter of the switching element S$#. Meanwhile, the anode terminal A of the power card PWC is connected to the constant current source 36 via the terminal T6. The constant current source 36 is powered by the direct current (DC) voltage source 34. The constant current source 36 is a power source of the temperature-sensitive diode SD used to detect the temperature which correlates the voltage drop VF at the temperature-sensitive diode when the forward current flowing through the temperature-sensitive diode SD is constant.

Figure 3:
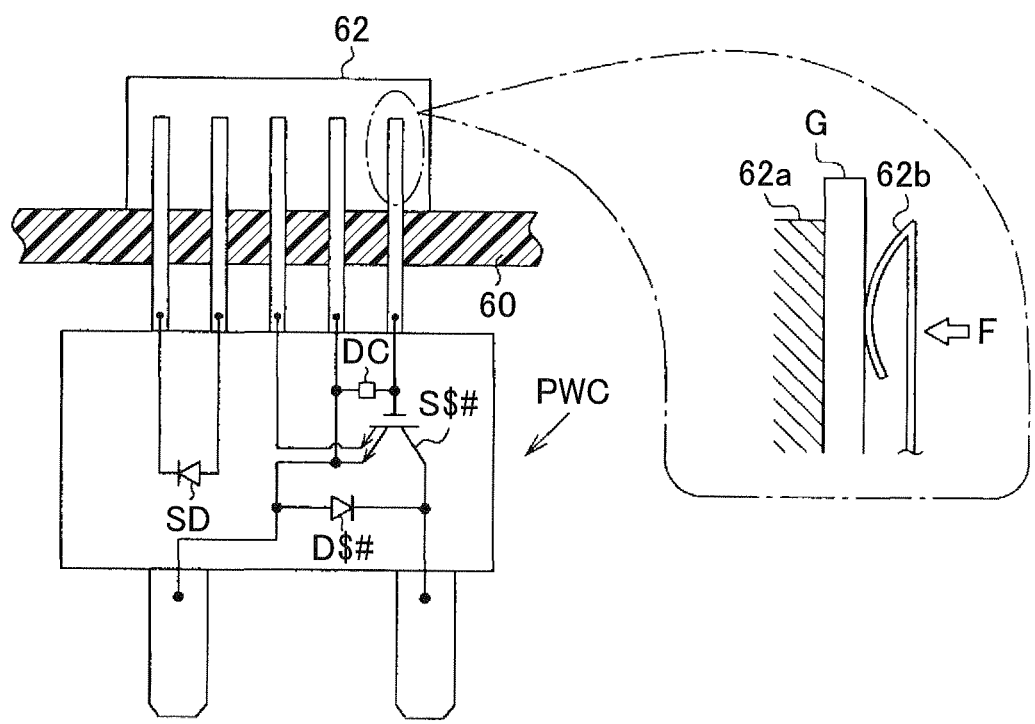
FIG. 3 is a cross section showing how to connect the power card to the substrate according to the first embodiment.

The terminal of the drive unit DU and the terminal of the power card PWC are connected via the connector 62 as shown in FIG. 3. Specifically, the above-described drive unit DU is mounted on the semiconductor substrate 60. The terminal of the power card is inserted into the connector 62 through the semiconductor substrate 60. The connector 62 includes conductors 62a and 62b as shown in an enlarge view of FIG. 3 (right side of FIG. 3). The conductor 62b has elasticity and applies force F towards normal line of the contact surface of the terminal of the power card PWC (gate terminal G is exemplified in FIG. 3). Thus, the force F is applied between the terminal of the power card PWC and the conductors 62a and 62b such that the force F is applied towards the normal line of respective contact surfaces between the terminal of the power card PWC and the conductors 62a and 62b. It is noted that both ends of the conduction path of the power card PWC (i.e., collector and emitter) are extended to the opposite side of the above-described terminals and connected to a bus-bar (not shown).

According to the first embodiment, the terminals of the power card PWC and the drive unit DU are connected without using soldering, whereby the power card does not have to be replaced even when the semiconductor substrate 60 is deteriorated. As a result, even when the semiconductor substrate 60 needs to be replaced, the power card PWC and the cooling device on which the power card is mounted does not have to be replaced so that the power card PWC and the cooling device can be used consistently.

However, in this case, when an oxidation is formed on the contact surface between the above-described conductors 62a and 62b of the above-described connector 62 and the terminal of the PWC due to fretting corrosion, conduction failure is likely to occur between the conductors 62a and 62b. When conduction failure occurs between the gate terminal G, the Kelvin-emitter terminal KE, and the conductors 62a and 62 while the switching element S$# is turned ON, the switching element S$# cannot be turned OFF.

According to the first embodiment, a protection circuit DC is included in the power card PWC so as to solve the above-described issue. Hereinafter is described about the protection circuit in detail.

As shown in FIG. 2, the protection circuit DC includes a comparator 50. The comparator 50 is configured to compare the voltage difference between both ends of the potential stored resistor 52 which is connected between the gate terminal G and the gate terminal of the switching element S$#. Specifically, a pull down resistor 54 is connected between the gate terminal G and the Kelvin-emitter terminal KE. The voltage drop at the pull down resistor 54 is applied to the non-inverting input terminal of the comparator 50 via the RC filter circuit including the filter resistor 56 and the capacitor 58. The voltage between the gate of the potential stored resistor 52 and the gate of the switching element S$# is applied to the inverting input terminal of the comparator 50. The output voltage Vcmp of the comparator 50 is outputted between the potential stored resistor 52 and the gate of the switching element S$#. The comparator 50 corresponds to determining means and reducing means and comparing means.

The power terminals of the comparator 50 are connected between the potential stored resistor 52 and the gate of the switching element S$#, and connected to the Kelvin-emitter terminal KE. According to the first embodiment, open-collector type comparator is exemplified. Therefore, when the voltage applied to the non-inverting input terminal V+ is lower than that of the inverting input terminal V−, the output voltage Vcm becomes logical Low (i.e., output terminal and the Kelvin-emitter terminal KE are conducted), meanwhile, when the voltage V+ is larger than the voltage V−, the output of the comparator becomes in a high impedance state.

The pull down resistor 54 is used to control the voltage potential of the gate terminal G to be pulled down to the voltage of the Kelvin-emitter when conduction failure occurs between the gate terminal G or the Kelvin-emitter terminal KE and the connector 62. The resistor value of the pull down resistor 54 is preferably selected to be large value so as to avoid the pull down resistor 54 influencing to the controllability of increase rate of the gate voltage caused by output current of the constant voltage source 24 flowing through the pull down resistor 54.

According to this configuration, when the above-described conduction failure occurs while the switching element has been steadily turning ON, the voltage difference between the gate terminal G and the Kelvin-emitter terminal KE decreases from the terminal voltage of the DC power source 22 to a voltage value divided by the potential stored resistor 52 and the pull down resistor 54 from the gate voltage Vge. This voltage drop is transmitted to the comparator 50 in response to a voltage drop at the capacitor 58. Then, the output voltage Vcm of the comparator 50 turns to logical Low and electric charge is discharged from the gate of the switching element S$#. Hence, the switching element S$# can be forcibly turned OFF.

Figure 4A:
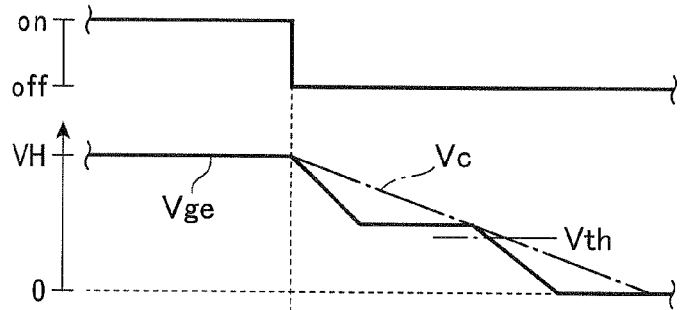
FIGS. 4A, 4B and 4C are timing diagrams showing operations according to the first embodiment.
Figure 4B:
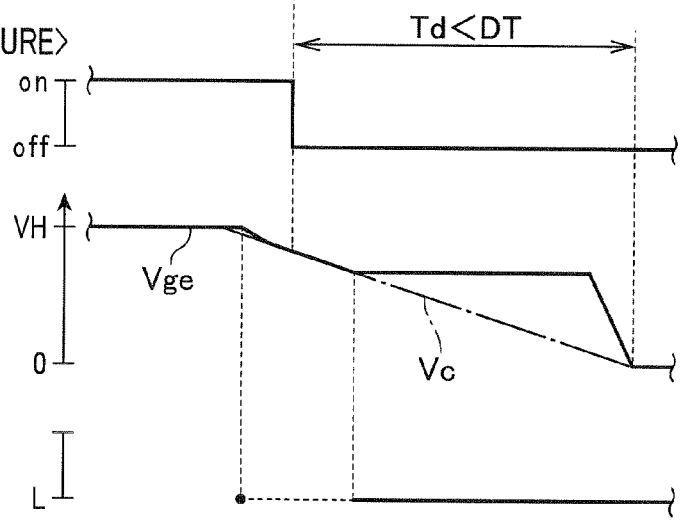
Figure 4C:
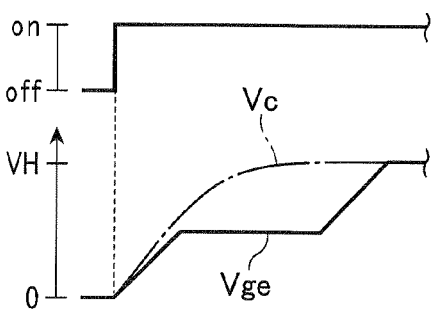

With reference to FIGS. 4A, 4B and 4C, an operation of the first embodiment is described as follows.

As shown in FIG. 4A (normal operation), it is described the normal operation in which the control signal g$# turns to OFF command from ON command when no conduction failures occur. In this case, turning the control signal g$# to be OFF command, the discharge switching element 30 as shown in FIG. 2 turns ON and the gate terminal G is connected to the Kelvin-emitter terminal KE via the discharge resistor 28 and the discharge switching element 30. Therefore, electric charge at the gate (gate charge) of the switching element S$# is discharged so that the gate voltage Vgs is decreased. It is noted that the decreasing rate of the discharge voltage Vc of the capacitor 58 is lower than that of the gate voltage Vge. Therefore, the output terminal of the comparator 50 becomes in a high impedance state. This function is to have electric charge at the gate to be discharged with a discharge rate which is adjusted by the resistor value of the discharge resistor 28, when no conduction failures occur. This is accomplished by including the filter resistor 56. The filer resistor 56 and the capacitor 58 correspond to control means.

Next, as shown in FIG. 4B (during conduction failure), it is described an operation when conduction failure occurs while the control signal g$# indicates ON command. In this case, voltage potential between the potential stored resistor 52 and the pull down resistor 53 is lower than the gate voltage Vge. Hence, the output voltage Vcmp of the comparator 50 becomes logical Low. Assuming the output voltage Vcmp continues to be logical Low, the gate voltage Vge rapidly decreases. However, practically, since the gate voltage Vge becomes below the charge voltage Vc of the capacitor 58, the output voltage of the comparator 50 becomes in a high impedance state. Accordingly, the gate voltage Vge follows the charge voltage Vc of the capacitor 58 which is being decreased, until the gate voltage Vge becomes the mirror voltage. Subsequently, the gate voltage Vge becomes constant during the mirror period, however, the charge voltage Vc of the capacitor 58 continuously decreases. As a result, after the mirror period, the output voltage Vcm of the comparator 50 is kept logical Low. In FIG. 4B, it is shown that the control signals g$# turns to OFF command while the gate voltage Vge is decreasing. Even in this case, since the discharge path of the gate charge is only a path including the potential stored resistor 52 and the pull down resistor 54, the voltage between the potential stored resistor 52 and the pull down resistor 54 is lower than the voltage of the gate voltage Vge.

It is noted that a predetermined period during which the switching element S$# turns OFF since the output voltage Vcmp of the comparator 50 becomes logical Low may preferably be lower than the dead time DT.

As shown in FIG. 4C (during ON operation), it is described hat the control signal g$# turns to ON command from OFF command when the above-described conduction failure has not been occurred. In this case, increase rate of the charge voltage Vc of the capacitor 58 is higher than increase rate of the gate voltage Vge. Hence, the output terminal of the comparator 50 becomes in a high impedance state, which can be adjustable by the resistor value of the filter resistor 56 and the capacitance value of the capacitor 58.

According to the first embodiment, following advantages can be obtained.

(1) The gate charge is forcibly discharged based on voltage difference between the gate voltage Vge and the voltage at the gate terminal G side (i.e., voltage at the gate terminal G is lower than the gate voltage Vge). Thus, switching element S$# can be turned OFF even when conduction failure has occurred between the power card PWC and the connector 62.

(2) When conduction failure has not occurred, the decreasing rate of the gate voltage Vge in response to the discharge switching element 30 turning ON is controlled to be higher than the decreasing rate of the charge voltage Vc of the capacitor 58. Thus, the discharge resistor 28 can determine the discharge rate of the gate at the switching element S$# without interference from the protection circuit DC (i.e., control means).

(3) The output voltage Vcmp of the comparator 50 (reducing means) is controlled to be changed based on whether or not the voltage at the gate terminal G side is lower than the gate voltage Vge. Hence, even when conduction failure is detected, normal operation can be resumed after the conduction failure is cancelled (operation resume means).

(4) The conductors 62a and 62b of the connector 62 are contacted to each other so as to apply force towards the normal line on the surface of the terminal at the power card PWC, thereby connecting the power card PWC and the conductors 62a and 62b of the connector 62. In this case, especially the protection circuit is beneficial, since conduction failure between the power card PWC and the conductors 62a and 62b is likely to occur.

(5) An open-collector type transistor is used for the comparator 50, whereby the protection circuit DC influencing to the charge rate of the gate of the switching element S$# can preferably be suppressed.

Second Embodiment

Figure 5:
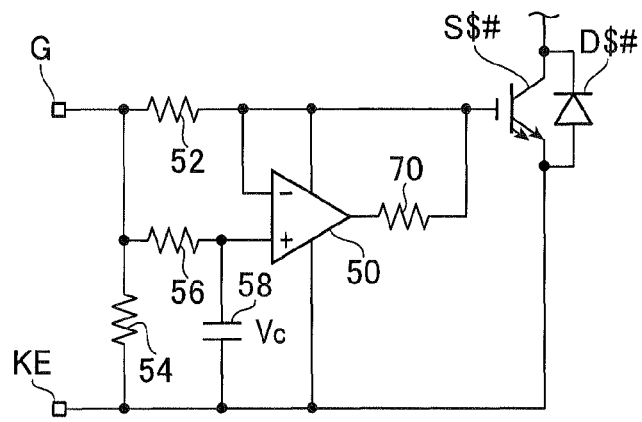
FIG. 5 is a circuit diagram showing a protection circuit according to the second embodiment.

With reference to FIG. 5, hereinafter is described configuration of the second embodiment that differs from the one of the first embodiment.

According to the first embodiment, when the conduction failure occurs and the gate voltage Vge decreases below the mirror voltage, decreasing rate of the gate voltage Vge becomes high. However, considering an amount of current (collector current Ic) flowing through the conduction path of the switching element S$# decreases after the mirror period, decreasing rate of the collector current is likely to become excessively high. According to the second embodiment, as shown in FIG. 5, an adjustment resistor 70 is disposed between the output terminal of the comparator 50 and the gate of the switching element S$#.

In FIG. 5, configurations corresponding to the one as shown in FIG. 2 are labeled as the same reference numbers.

Third Embodiment

Figure 6:
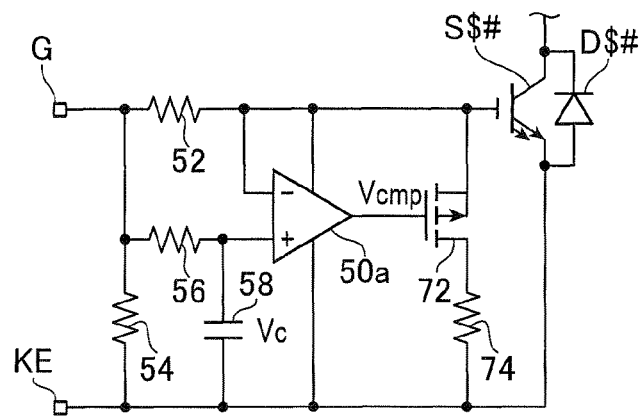
FIG. 6 is a circuit diagram showing a protection circuit according to the third embodiment.

With reference to FIG. 6, hereinafter is described configuration of the third embodiment that differs from the one of the first embodiment.

As shown in FIG. 6, a configuration of the protection circuit DC according to the third embodiment is described as follows. In FIG. 6, configurations corresponding to the one as shown in FIG. 2 are labeled as the same reference numbers.

According to the third embodiment, instead of the comparator 50 which is open-collector type, the configuration includes a comparator 50a that outputs own power supply voltage used therefor as a logical High output. Moreover, a series-connected module including P channel MOS FET (metal oxide field effect transistor, suppressing switching element 72) and a suppressing resistor 74 are disposed between the control terminal (gate) of the switching element S$# and the reference terminal (Emitter) of the switching element S$#. The output voltage of the comparator 50a is outputted to the gate of the suppressing switching element 72.

According to the above-described configuration, when the voltage V+ at the non-inverting input of the comparator 50a is lower than the voltage V− at the inverting input of the comparator 50a, the output voltage Vcmp of the comparator 50a turns to logical Low so that the suppressing switching element 72 turns ON. As a result, the gate charge of the switching element S$# is discharged via the suppressing switching element 72.

Fourth Embodiment

Figure 7:
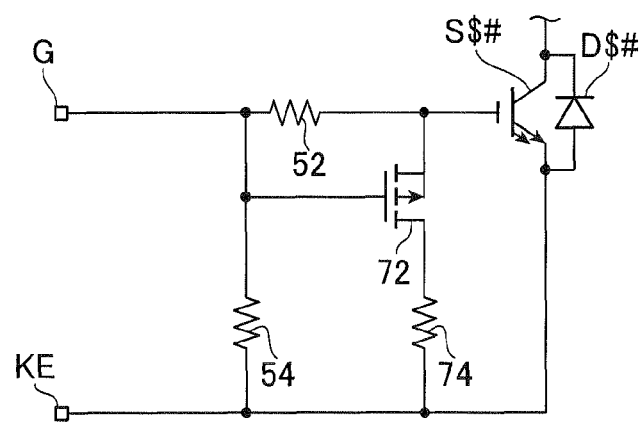
FIG. 7 is a circuit diagram showing a protection circuit according to the fourth embodiment.

With reference to FIG. 7, hereinafter is described configuration of the fourth embodiment that differs from the one of the first embodiment.

As shown in FIG. 7, a configuration of the protection circuit DC according to the fourth embodiment is illustrated. In FIG. 7, configurations corresponding to the one as shown in FIG. 2 are labeled as the same reference numbers.

According to the fourth embodiment, as shown in FIG. 7, a series-connected module including a P channel MOS FET (suppressing switching element 72) and a suppressing resistor 74 is disposed between the control terminal (gate) of the switching element S$# and the reference terminal (emitter) of the switching element S$# and voltage between the pull down resistor 54 and the potential stored resistor 52 (voltage at the gate terminal G) is applied to the gate of the suppressing switching element.

In this case, the voltage at the gate terminal G decreases to be lower than the voltage between the switching element S$# and the potential stored resistor 52, whereby the suppressing switching element 72 turns ON. Hence, when conduction failure occurs between the gate terminal G and the drive unit DU, electric charge at the gate of the switching element S$# is discharged via the suppressing switching element 72.

However, according to the fourth embodiment, even when conduction failure does not occur between the gate terminal G and the drive unit DU, the gate charge is discharged via not only the discharge switching element 30 but also the suppressing switching element 72, in response to the control signal g$# turning to the OFF command. Accordingly, the resistor value of the discharge resistor 28 is preferably determined considering the resistor value of the suppressing resistor 74 such that the total resistance value including the suppressing resistor 74 is appropriate value.

Other Embodiments

Above-described embodiments may be modified as follows.

Regarding the comparing means, in the above-described embodiments, the power supply terminal of the comparator 50 is connected to the control terminal (between the potential stored resistor 52 and the gate). However, it is not limited to this configuration. For example, a dedicated capacitor as a power supply of the comparator 50 may be employed. Specifically, the dedicated capacitor stores electric charge outputted from the gate terminal of the power card PWC and supplies power to the comparator 50 as a power supply of the comparator 50.

The open collector type comparator does not have to be used when a configuration in which comparing means serves as potential reducing means is employed. For example, a configuration of the second embodiment (FIG. 5) in which a comparator outputs logical High when the voltage V+ at the non-inverting input is larger than the voltage V− at the inverting input can be employed. In this instant, output current of the constant current source 24 is designed considering the output of the comparing means.

In the configuration of the third embodiment (FIG. 6), a pull up resistor can be disposed between the output terminal and the gate of the switching element S$# and an open collector type comparator can be used instead of the comparator 50a.

According to the above-described embodiments, the comparator directly compares the voltage at one end of the potential stored resistor 52 with respect to the reference potential (emitter voltage) and the voltage at the other end of the potential stored resistor 52 with respect to the reference potential. However, it is not limited to this method to compare the voltage differences. For example, the comparator may compare voltage differences which are divided in the following ways, a) divide voltage difference between the voltage at a point between the potential stored resistor 52 and the gate of the switching element, and the voltage at the Kelvin-emitter terminal KE;

b) divide voltage difference between the gate terminal G of the power card PWC and the Kelvin-emitter terminal KE; and c) compare divided voltages a) and b).

The dividing ratio is preferably set as the same ratio, however, it is not necessary. For example, dividing ratio of the voltage difference between the gate terminal G of the power card PWC and the Kelvin-emitter terminal KE can be set to be larger than that of the voltage difference between the voltage at a point between the potential stored resistor 52 and the gate of the switching element, and the voltage at the Kelvin-emitter terminal KE. Even in this case, when conduction failure occurs at the gate terminal G while the switching element S$# is turned ON, the comparing means can determine the voltage difference between the gate terminal G of the power card PWC and the Kelvin-emitter terminal KE is smaller than the voltage difference between the voltage at a point between the potential stored resistor 52 and the gate of the switching element, and the voltage at the Kelvin-emitter terminal KE.

Regarding the potential reducing means, in the third embodiment (FIG. 6), signals connected to the inverting input and the non-inverting input can be replaced each other and the suppressing switching element 72 can be replaced to N channel MOS FET instead of the P channel MOS FET.

Regarding the RC filter circuit, in the second embodiment (FIG. 5), the filter resistor 56 can be removed. However, in this case, when the gate charge is discharged in response to the discharge switching element 30 turning ON, the gate charge is discharged via the adjustment resistor 70 and the comparator 50. Considering this situation, resistance value of the discharge resistor 28 is selected.

According to the above-described embodiments, when the constant current source 24 is included in the drive unit, even without filter resistor 56, rush current does not flow into the capacitor 58 when the gate is charged.

Regarding the capacitor 58, in the second embodiment (FIG. 5), the filter resistor 56 and the RC filter circuit including the capacitor 58 can be removed. However, in this case, considering that the gate charge is discharged by the comparator 50, resistance values of the discharge resistor 28 and the adjustment resistor 70 is selected.

Regarding the determining means, conduction failure is determined based on whether or not voltage is applied from outside the power card PWC, to a conduction path (i.e., second conduction path) between the gate terminal G of the power card PWC and the gate of the switching element S$#. Specifically, conduction failure is determined based on whether or not voltage is applied while the gate is being charged. However, it is not limited to this determining process. For example, according to the first embodiment (FIG. 2), the power card PWC includes a capacitor used for applying voltage to the inverting input of the capacitor 50 and the charge voltage of the capacitor is kept constant while the control signals g$# turn ON and OFF for several periods.

Moreover, it is not limited to determining process in which conduction failure is determined based on whether or not voltage is applied to a conduction path externally. For example, a capacitor and a resistor is connected in parallel (parallel connected resistor block) to a point between the gate terminal and the Kelvin-emitter terminal KE and conduction failure may be determined when the charge voltage of the capacitor decreases and the decreasing rate of charge voltage is low. This is because, the decreasing rate at the discharge path comprising only the parallel connected resistor block is smaller than the decreasing rate at the discharge path comprising the discharge resistor 28, comparing a decreasing rate of the charge voltage of the capacitor at two discharge paths.

Regarding the switching module, the power card PWC may not include temperature-sensitive diode SD or the sense terminal SE.

Regarding disposition of connecting means (62), the disposition of the connecting means is not limited to dispose the connecting means on the surface (component surface) of the semiconductor substrate 60 which is opposite to a surface on which the power card PWC is disposed. However, the connecting means can be disposed on the surface on which the power card PWC is disposed. Further, the conductor 62 is not limited to a conductor having elastic body that is able to apply force on the surface of the power card PWC.

Regarding the switching element used for objects to be driven by the drive circuit, it is not limited to the IGBT, however, for example, a MOS FET type transistor can be used. The channel type is not limited to N channel, however, P channel type MOS FET can be used. Even in this case, the current conduction path (between source and drain) is opened or closed by controlling the voltage at the control terminal (gate) with respect the reference terminal (terminal voltage is equivalent to the voltage potential of the source) which is disposed at one end terminal side of the conduction path. The control terminal and the reference terminal of which potential is equivalent to the one of the source terminal are connected to the drive unit DU.

What is claimed is:

1. A switching module comprising:
a switching element having a control terminal, electrically connected to a first conduction path including a reference terminal, the first conduction path being opened and closed by controlling the switching element to be ON and OFF, the switching element being controlled in response to a voltage difference between the reference terminal and the control terminal;
determining means for determining whether or not a conduction failure has occurred between the control terminal and an outside the switching module; and reducing means for reducing an absolute value of the voltage difference when the determining means determines that the conduction failure has occurrectso as to forcibly turn OFF the switching element, wherein:

the switching module includes a second conduction path that electrically connects the control terminal and a chive circuit disposed on a semiconductor substrate which is outside the switching module; and the determining means is configured to determine whether or not a conduction failure has been occurred based on whether or not voltage is applied to a second conduction path externally, and the determining means includes:

a pull down resistor used to pull down the second conduction path to be pulled down to a voltage potential of the reference terminal;

a potential stored resistor disposed in the second conduction path to be closer to the control terminal than a connection point between the pull down resistor and the second conduction path; and comparing means for comparing an absolute value of a voltage drop at the pull down resistor with an absolute value of a voltage between the potential stored resistor and the control terminal with respect to the reference terminal, the reducing means is configured to reduce the absolute value of the voltage difference when the comparing means determines that the absolute value of a voltage between the potential stored resistor and the control terminal with respect to the reference terminal is larger than the absolute value of a voltage drop at the pull down resistor.

2. The switching module according to claim 1, wherein the switching means includes operation resume means for resuming an operation of the switching module such that after the determining means determines a conduction failure has been occurred and determines the conduction failure does not exist anymore, the operation resuming means stops the reducing means to reduce the absolute value of the voltage difference.

3. The switching module according to claim 2, wherein
the switching module is connected to a drive circuit disposed on a substrate which is outside the switching module, and
switching module includes control means for controlling the determining means and the reducing means so as to restrict reducing of the absolute value of the voltage difference when the control terminal and the reference terminal are connected by the drive circuit.

4. The switching module according to claim 1, wherein the switching means includes operation resume means for resuming an operation of the switching module such that after the determining means determines a conduction failure has been occurred and determines the conduction failure does not exist anymore, the operation resuming means stops the reducing means to reduce the absolute value of the voltage difference.

5. The switching module according to claim 1, wherein the switching means includes operation resume means for resuming an operation of the switching module such that after the determining means determines a conduction failure has been occurred and determines the conduction failure does not exist anymore, the operation resuming means stops the reducing means to reduce the absolute value of the voltage difference.

6. The switching module according to claim 1, wherein
the switching module is connected to a drive circuit disposed on a substrate which is outside the switching module, and
switching module includes control means for controlling the determining means and the reducing means so as to restrict reducing of the absolute value of the voltage difference when the control terminal and the reference terminal are connected by the drive circuit.

7. The switching module according to claim 1, wherein
the switching module is connected to a drive circuit disposed on a substrate which is outside the switching module, and
switching module includes control means for controlling the determining means and the reducing means so as to restrict reducing of the absolute value of the voltage difference when the control terminal and the reference terminal are connected by the drive circuit.

8. The switching module according to claim 1, wherein
the switching module is connected to a drive circuit disposed on a substrate which is outside the switching module, and
switching module includes control means for controlling the determining means and the reducing means so as to restrict reducing of the absolute value of the voltage difference when the control terminal and the reference terminal are connected by the drive circuit.

9. The switching module according to claim 1, wherein
the switching module includes a capacitor to be charged in response to a voltage drop at the pull down resistor,
the comparing means is configured to receive a charge voltage of the capacitor as a voltage drop at the pull down resistor, and
a decreasing rate of the absolute value of the voltage difference when the drive circuit turns the switching element OFF in response to a control signal of the switching element is larger than a decreasing rate of an absolute value of the charge voltage of the capacitor when the capacitor is discharged via the pull down resistor.

10. The switching module according to claim 1, wherein the switching module is electrically connected to a drive circuit disposed on a substrate provided with connecting means including a conductor, the connecting means is configured to connect the control terminal and the conductor such that the conductor applies force towards a normal line of a contact surface of the control terminal so as to electrically connect the switching module and the drive circuit.

* * * * *